US006172629B1

(12) United States Patent
Fetterman

(10) Patent No.: US 6,172,629 B1
(45) Date of Patent: Jan. 9, 2001

(54) MULTISTAGE ANALOG-TO-DIGITAL CONVERTER EMPLOYING DITHER

(75) Inventor: H. Scott Fetterman, New Tripoli, PA (US)

(73) Assignee: Lucent Technologies Inc., Murray Hill, NJ (US)

(*) Notice: Under 35 U.S.C. 154(b), the term of this patent shall be extended for 0 days.

(21) Appl. No.: 09/025,956

(22) Filed: Feb. 19, 1998

(51) Int. Cl.$^7$ .................................................. H03M 1/20
(52) U.S. Cl. ........................................ 341/131; 341/161
(58) Field of Search ................................... 341/155, 143, 341/141, 161, 131

(56) References Cited

U.S. PATENT DOCUMENTS

| | | | |
|---|---|---|---|
| 4,549,220 | * 10/1985 | Suzuki | 358/283 |
| 4,751,496 | 6/1988 | Araki et al. | 340/347 AD |

(List continued on next page.)

OTHER PUBLICATIONS

S. H. Lewis, "A Pipelined 9–staged Video–Rate Analog to Digital Converter", 1991.*

Analog Devices. "12 Bit, 41 MSPS Monolithic A/D converter", 1996.*

Paul Allan Conway, "The Application of Random Dither to a Digital Codec," The British Library Document Supply Centre, University of Bradford, 1988.

Yoshio Yamasaki, "The Application of Large Amplitude Dither to the Quantization of Wide Range Audio Signals," Journal of the Japan Audio Society, vol. 39, No. 7, (1983), pp. 452–462.

Risbo, Lars, "On the Design of Tone–Free Sigma Delta Modulators," IEEE Transactions On Circuits and Systems–II: Analog and Digital Signal Processing, vol. 42, No. 1, Jan. 1995, pp. 52–55.

Candy, James C., and Gabor C. Temes, "Oversampling Methods For A/D and D/A Conversion, " pp. 1–25.

Tewksbury, Stuart K. and Robert W. Hallock, "Oversampled, Linear Predictive and Noise–Shaping Coders of Order N≧1," IEEE Transactions On Circuits and Systems, vol. Cas–25, No. 7, Jul. 1978, pp. 139–149.

Norsworthy, Steven R., "Optimal Nonrecursive Noise Shaping Filters For Oversampling Data Converters Part 1: Theory, Part 2: Applications."

Dunn, Chris and Mark Sandler, "A Simulated Comparison of Dithered and Chaotic Sigma–Delta Modulators," presented at the 97th Convention 1994 Nov. 10–13, AES, pp. 1–37.

Norsworthy, Steven R. and David A. Rich, "Idle Channel Tones and Dithering in Delta–Sigma Modulators," Presented at the 95th Convention 1993 Oct. 7–10, AES, New York, pp. 1–29.

Patent Abstracts of Japan, vol. 014, No. 168 (E–0912), Mar. 30, 1990 and Japan 02 025116A (Toshiba Corp.), Jan. 26, 1990. Abstract only.

Norsworthy, S. R., "Effective Dithering of Sigma–Delta Modulators," Proceedings of the International Symposium on Circuits and Systems, San Diego, May 10–13, 1992, vol. 3 of 6, May 10, 1992, Institute of Electrical and Electronics Engineers, pp. 1304–1307.

Lewis, et al., "A 10–b 20–Msample/s Analog–to–Digital Converter," IEEE Journal of Solid State Circuits, Mar. 1992, vol. 27, pp. 351–358.

David A. Johns and Ken Martin, "Analog Integrated Circuit Design," pp. 513–516, 523–528, published by John Wiley & Sons, Inc., 1997.

*Primary Examiner*—Peguy Jean Pierre
(74) *Attorney, Agent, or Firm*—David L. Smith

(57) ABSTRACT

There is disclosed, a converter for converting an input signal from one form to another. The converter includes a slicing circuit adapted to slice a signal into levels. The slicing circuit includes at least one threshold for establishing slicing levels. Dither is employed to vary at least one slicing level in the slicing circuit.

25 Claims, 4 Drawing Sheets

U.S. PATENT DOCUMENTS

| | | | | |
|---|---|---|---|---|
| 4,855,745 | * | 8/1989 | Smither | 341/156 |
| 4,857,927 | | 8/1989 | Takabayashi | 341/131 |
| 5,001,481 | * | 3/1991 | Lee | 341/136 |
| 5,073,777 | | 12/1991 | Fukuhara et al. | 341/131 |
| 5,144,308 | | 9/1992 | Norsworthy | 341/131 |
| 5,327,131 | * | 7/1994 | Ueno et al. | 341/136 |
| 5,383,033 | * | 1/1995 | Takahashi | 358/456 |
| 5,416,481 | * | 5/1995 | Chen | 341/131 |
| 5,729,571 | * | 3/1998 | Park et al. | 375/206 |
| 5,805,305 | * | 9/1998 | Abe | 358/457 |
| 5,818,372 | * | 10/1998 | Noro | 341/131 |
| 5,889,482 | * | 3/1999 | Zarunbinsky et al. | 341/131 |

\* cited by examiner

MULTISTAGE ANALOG-TO-DIGITAL CONVERTER EMPLOYING DITHER

FIELD OF THE INVENTION

This invention relates to multistage converters and in particular to multistage analog-to-digital converters employing dither to reduce non-linearity.

BACKGROUND OF THE INVENTION

Analog-to-digital converters (ADCs) convert an analog input into a corresponding digital representation. Multiple stage ADCs include a plurality of stages, each of which contributes to the digital representation. Multistage converters receive an analog signal in a first stage for processing. The first stage determines one or more bits. A residue is generated and passed to a subsequent stage for processing to determine one or more additional bits. This process continues through each of the stages of the converter. When each stage completes processing a sample or residue, it receives a new sample or residue to process. One type of multiple stage converter is known as a pipelined converter. Pipelining causes an initial latency in computation time required to fill the pipeline, but increases the throughput of the converter due to parallel processing.

Each stage of a multistage ADC may produce more bits than the output of that stage represents in a digital representation of a sampled representation of the analog signal input to the first stage of the converter, providing some redundancy of information for error correction. Error correction may be provided to ease the precision of each stage of conversion. An error corrector receives the bits produced by each stage of the multistage converter and generates a digital output representative of the sampled analog input. The digital error corrector output is also the digital output from the converter.

Multistage converters are disclosed in various publications, including "A 10-b 20-Msample/s Analog-to-Digital Converter", by Lewis, et al, IEEE Journal of Solid State Circuits, March 1992, Vol. 27, pp. 351–358, and Analog Integrated Circuits Design, by D. A. Johns and K. Martin, the disclosures of which are hereby incorporated by reference.

One known technique to reduce non-linearity in an analog-to-digital converters is to add random noise to the input signal. Adding random noise to the input signal reduces the signal-to-noise ratio of the converter. To reduce non-linearity without reducing the signal-to-noise ratio, random noise energy may be added to the signal in a frequency range that is not of interest. However, for this technique to be useful in a particular application, there must be a frequency range that is not of interest where the noise can be added. In applications requiring the full range of available bandwidth for a signal, this technique could not be used. Furthermore, each of these techniques reduce the dynamic range of a converter in which they are used.

What is needed is a technique to reduce non-linearity in a multistage analog-to-converter that does not significantly reduce the dynamic range of the converter. While error correction techniques corrects for some types of errors, the accuracy of the conversion would be enhanced by introduction of dither to decrease the magnitude of spurious tones in a manner that spreads the spurious tones out over a wider frequency range than they occupy absent dither. Such a technique would retain the desirable aspects of introducing dither without using a portion of the frequency spectrum or reducing dynamic range, thereby leaving the entire frequency spectrum for signal.

SUMMARY OF THE INVENTION

In accordance with the invention, a converter for converting an input signal from one form to another includes a slicing circuit adapted to slice a signal into levels. The slicing circuit includes at least one threshold for establishing slicing levels. Dither is employed to vary at least one slicing level in the slicing circuit.

DETAILED DESCRIPTION

Figure 1:
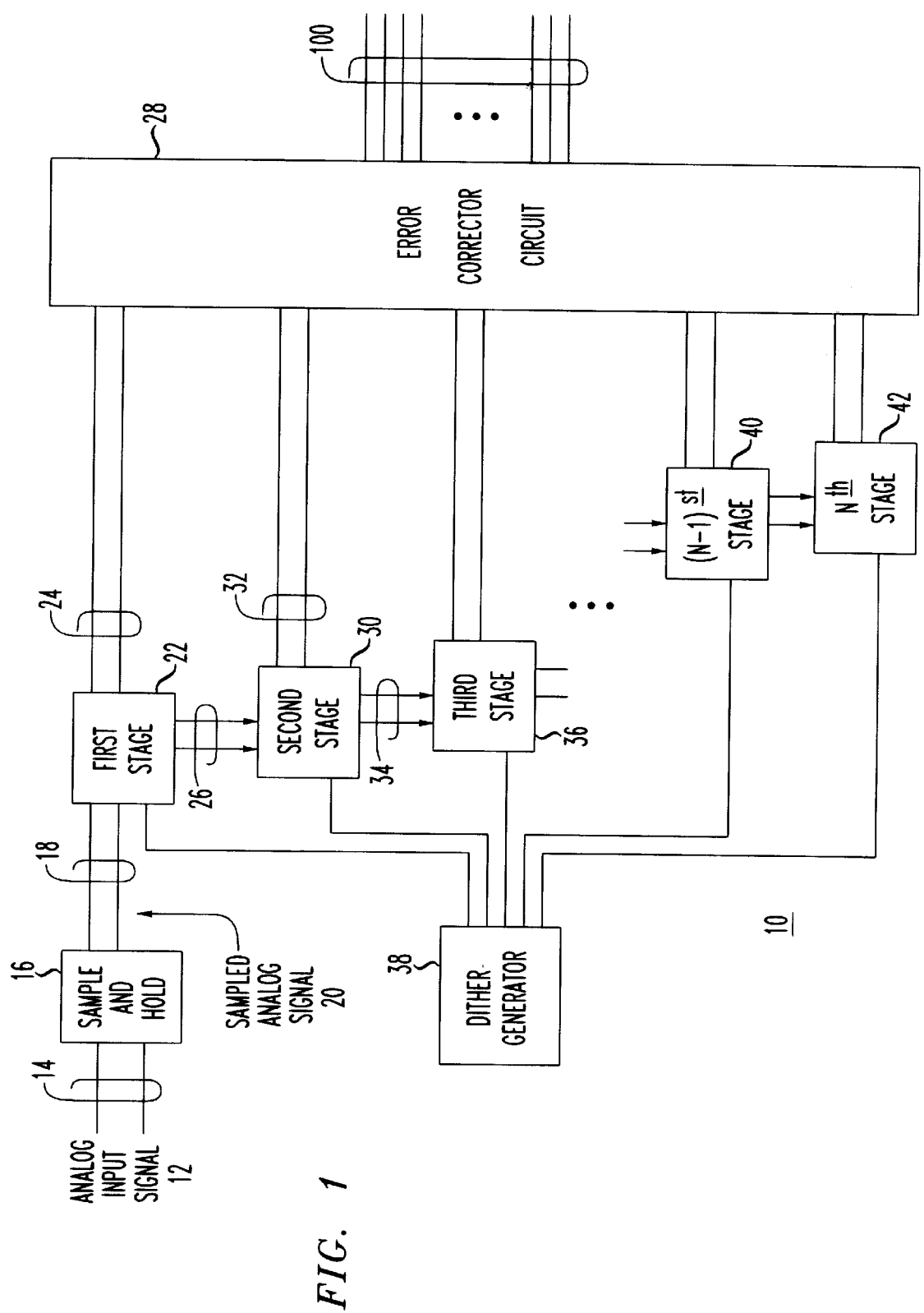
FIG. 1 is a simplified schematic diagram of a portion of a multistage analog-to-digital converter in accordance with the present invention.

A simplified schematic diagram of multistage ADC 10 in accordance with an illustrative embodiment of the invention is shown in FIG. 1. For purposes of illustration, an (N+1)-bit converter 10, with each stage generating two bits of output, will be discussed. Although a fully differential converter is illustrated, it is understood that one skilled in the art could implement the converter as a single ended circuit. In the illustrative example, each stage, sometimes referred to as a pipe, produces two bits of output. To achieve an (N+1)-bit output from the converter, N stages are provided. However, the invention is not limited thereto. One skilled in the art could implement a converter that produces a different number of bits output, or a converter having a different number of stages, or a converter having stages that produce a different number of bits than the illustrative embodiment. The converter may be a stand-alone converter or may be a portion of an integrated circuit such as a microprocessor, microcontroller, digital signal processor, codec, radio, or other mixed signal integrated circuit.

A scaled analog input signal 12 is applied to the input 14 of sample and hold circuit 16. Sample and hold circuit 16 provides as an output 18 a sampled analog signal 20. First stage 22 receives the sampled analog signal 20 as an input and generates a first stage digital output 24 representative of the sampled analog signal 20. In the illustrative embodiment, the first stage digital output 24 is two bits. The sampled analog signal 20 is represented by the first stage digital output 24 and the first stage residue 26. The first stage residue 26 is provided as an input to the second stage. The first stage digital output 24 is provided as an input to error corrector circuit 28.

Second stage 30 receives as an input the first stage residue 26. Second stage 30 generates a second stage digital output 32 representative of the first stage residue 26. In the illustrative embodiment, the second stage digital output 32 is two bits. The first stage residue 26 is level shifted and increased by a gain factor, resulting in a second stage residue 34. The second stage residue 34 is provided as an input to third stage 36. The second stage digital output 34 is provided as an input to error corrector circuit 28.

Dither from dither generator 38 is provided to at least one stage of multistage converter 10. Dither may be applied to selected ones of the stages or may be applied to all of the stages. The same or different dither signals may be provided to each stage to which dither is applied.

Error corrector circuit 28 is a logic circuit that receives as inputs the digital outputs generated by each stage of converter 10. The digital outputs from each stage represent signal samples, which may be stored upon receipt by error corrector circuit 28, that are skewed in time due to the structure of the converter. As is known in the art, error corrector circuit 28 corrects errors based on the redundant information contained in the digital outputs, and provides a multibit output, digital output 100, of a predetermined number of bits that is also the output of converter 10. Error corrector circuit 28 also corrects for changes in the digital outputs due to the effects of dither on the digital outputs, which are provided as inputs to the error corrector circuit.

Figure 2:
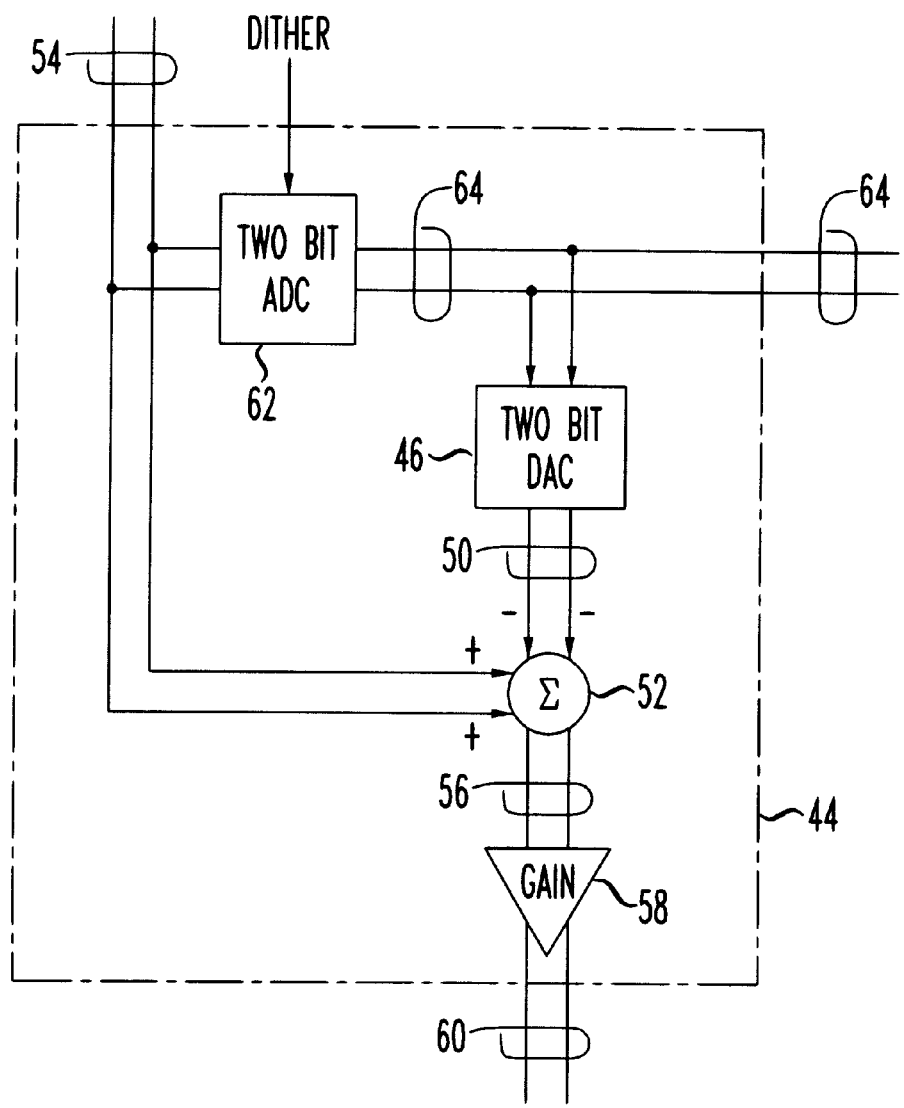
FIG. 2 is a simplified schematic diagram of a typical stage of a multistage converter useful in the multistage analog-to-digital converter of FIG. 1.

FIG. 2 is a simplified block diagram of a typical stage 44, such as first stage 22, second stage 30, third stage 36, (N–1)st stage 40, or Nth stage 42, of a multistage converter 10. Analog input signal 54 is provided as an input to analog-to-digital subconverter 62. Subconverter 62 converts the analog input signal to a digital signal, such as a digital output 64. Digital output 64 is provided to both an error corrector circuit 28 and two-bit digital-to-analog converter 46. Digital-to-analog converter 46 is a digital-to-analog converter that receives the digital output 64 from subconverter 62 and converts the digital representation to a corresponding analog signal 50. Analog signal 50 is presented as an input to summing node 52. Analog input signal 54 is provided as another input to summing node 52. Summing node 52 subtracts the analog signal 50 from analog input signal 54, thereby removing from analog input signal 54 the portion of the signal represented by digital output 64, to provide an analog difference signal 56, an internal stage residue. Difference signal 56 is provided as an input to amplifier 58, which provides a very accurate gain. In a preferred embodiment, the gain of amplifier 58 is a gain of two. Amplifier 58 provides as an output an amplified difference signal 60 as an analog output that is an amplified (gained-up) version of the internal stage residue of stage 44. Variations in the gain of the stages other than being as designed, results in discontinuities in the output-to-input relationship of the stage which results in the digital output from that stage not accurately reflecting the analog input. Not accurately reflecting the analog input results in an erroneous digital output for a given analog input, which appears as spurious tones in the frequency domain. Increasing the difference signal by a gain factor in amplifier 58 of each stage, coupled with level shifting the signal by the digital output 64 as is known in the art, maintains the signal-to-noise ratio, and maintains the amplified difference signal 60 within the range of the analog circuitry. Amplified difference signal 60 is a residue of stage 44 provided to a subsequent stage, if present, for further processing.

The analog input signal to the first stage 22 is the sampled analog signal 20. The analog input signal to subsequent stages is the residue from a previous processing stage. The Nth stage need not provide a residue as there is no subsequent stage.

With dither introduced to vary the slicing level or levels of a stage, the digital output 64 from that stage provided to error corrector circuit 28 will differ from when dither is not present. When dither or other analog-to-digital subconverter effects such as inadequate settling time, offset, or charge injection, cause subconverter 62 to make a level slicing decision that is different than when dither is not present, difference signal 56 will be different, in an absolute magnitude sense, than it would be absent the dither. Amplifier 58 must accommodate a potentially larger difference signal, and the subsequent stage, if present, must be able to accommodate receiving a larger analog input signal. One technique to accommodate the potential of a larger residue is to use a two-bit subconverter 62 when a single bit subconverter would otherwise suffice. The additional bit provides redundant information that is used by error corrector circuit 28. Any error in analog-to-digital conversion made by subconverter 62, such as due to settling or offset, is corrected by the error corrector circuit.

Figure 3:
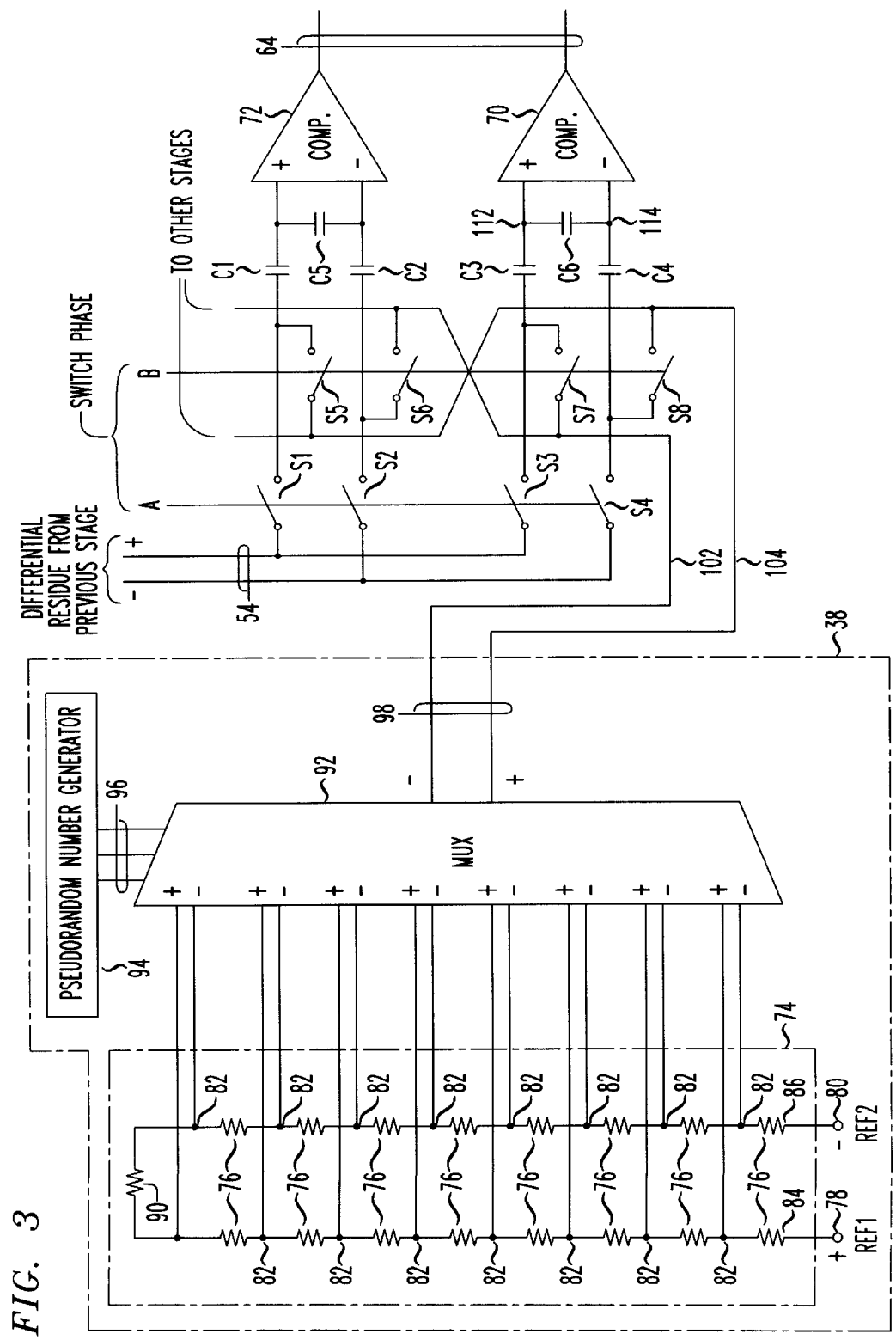
FIG. 3 is a simplified schematic diagram of an analog-to-digital sub-converter useful in the multistage analog-to-digital converter of FIG. 1.

Subconverter 62 converts an analog input signal to a digital output signal. An analog signal may be sliced into a predetermined number of levels to generate a digital representation or digital output signal. Slice points demark one level from an adjacent level or levels. Slicing a signal into levels requires one less slice point than the number of levels into which a signal is sliced. Subconverter 62 may be implemented as a slicing circuit using comparators as shown in FIG. 3. Two comparators 70 and 72 receiving as an input the signal to be sliced may be employed to develop a two-bit digital output. Slicing a signal into levels using comparators requires one less comparator than the number of levels into which the signal is sliced. The slice points may be determined by setting the comparator thresholds that determine whether the comparator output of each comparator is a logic one or a logic zero.

To slice a signal into three levels as in the illustrative embodiment of FIG. 3, two slice points, and thus two comparators, may be employed. Representing as a binary number which of the three levels the sliced signal falls into requires two bits. Slicing the signal into more levels may require more comparators and may require a different, higher, number of bits to represent as a binary number which of the levels the sliced signal falls into. Less than all of the combinations of bits may be used.

A switched capacitor implementation of a subconverter 62 is shown in FIG. 3 in which two comparators 70 and 72 develop a two bit digital output 64. The two bit digital output 64 represents a +1, 0, or –1, which in turn represents one of the three levels into which the signal is sliced. The digital output 64 is used by the error corrector circuit 28 to determine the digital output 100, and for level shifting the internal stage residue. Each comparator receives as a first input the amplified difference signal 60, or in the case of first stage 22 sampled analog signal 20, and as a second input one or more threshold settings for comparators 70 and 72.

In accordance with the invention, at least one slicing point in at least one analog-to-digital subconverter 62 in a multistage converter 10 is dithered to provide a random slicing point. The potential threshold levels applied to comparators 70 and 72 can be generated by a noise generator. Noise amplitude may be quantized or continuous; time may be discretized or continuous. One technique for dithering a threshold develops a plurality of potential threshold levels as voltages in an digital-to-analog converter. Examples of digital-to-analog converters include but are not limited to resistor divider, capacitor divider, and ratioed MOSFETs. Resistor string 74 is comprised of a plurality of resistors 76 coupled between a first potential reference 78 at one end of the resistor string and a second potential reference 80 at the other end of the resistor string. Between contiguous resistors 76 in the resistor string, and possibly between the resistor string and an energy source energizing resistor string 74, are taps 82. With an energy source coupled to energize resistor string 74, each tap provides a potential threshold level.

The range of potential threshold levels available to be applied to comparators 70 and 72 depends on the first and second reference potential 78 and 80, the magnitude or resistance of resistors 76 comprising resistor string 74, and the magnitude or resistance of resistors 84 and 86. The magnitude or resistance of resistors 76 comprising resistor string 74 need not be identical. The resistance of resistors 76 determines the potential threshold levels within the range of potential thresholds. Although the potential thresholds are illustrated in FIG. 3 as being symmetric about a center resistor 90, the invention is not limited thereto.

Taps 82 are coupled through a selection circuit, such as multiplexer 92, to provide at least one of the potential threshold levels to comparators 70 or 72. The potential threshold levels are coupled to multiplexer 92 in plus/minus pairs that are symmetric about center resistor 90. The invention, however, is not so limited. The potential threshold levels may be coupled to comparators 70 and 72 over lines 102 and 104, which may also couple to other stages. The crossover in lines 102 and 104 provides the same threshold level to the opposite sign inputs of comparators 70 and 72, although the invention is not limited thereto.

An example of a quantized amplitude, discretized noise generator is illustrated as dither generator 38, although the invention is not limited thereto. One technique of selecting which potential threshold level to apply to comparators 70 and 72 as a threshold employs a pseudo-random number generator 94. Pseudo-random number generator 94 generates a random number which may be one of a predetermined number of random numbers. The random numbers may, for example, have the same probability of being generated, although the invention is not limited thereto. The random numbers may have an unequal probability of being generated. The random number is applied as an input to a digital-to-analog converter illustrated as resistor string 74 and multiplexer 92. The random number is applied to the select inputs 96 of multiplexer 92 to select one pair of the potential thresholds generated at taps 82 as outputs 98 of multiplexer 92 for application to comparators 70 and 72 over lines 102 and 104. Randomly varying which potential threshold from taps 82 are applied to comparators 70 and 72 as a threshold, and thus randomly varying the slice points of comparators 70 and 72, introduces the effects of dither in the digital output from analog-to-digital subconverter 62. The same random number from pseudo-random number generator 94, or a different pseudo-random number, may be applied to each stage of converter 10 to which dither is provided.

In the switched capacitor implementation illustrated in FIG. 3, clock phases A and B are generated as two phases of a non-overlapping clock signal. Switched phases A and B operate the switches S1, S2, S3, S4, S5, S6, S7, and S8, as is known in the art. With clock phase B high, switches S1, S2, S3, and S4 are opened isolating the differential inputs of comparators 70 and 72 from the residue from the previous stage. Switches S5, S6, S7, and S8 are closed to establish reference conditions on capacitors C1, C2, C3, and C4. Additional switches (not shown) couple the differential inputs of comparators 70 and 72 to a reference (not shown), such as a reference voltage. The reference charges capacitors C1, C2, C3, and C4 to maintain the comparators in a linear operating region. When clock phase B transitions low, the reference is stored on capacitors C1, C2, C3, and C4 at the comparator inputs.

When clock phase A transitions high, the input to a stage is coupled to the differential inputs of the comparators and to the residue which is passed on through the same capacitors C1, C2, C3, and C4 that were charged while clock phase B was high. At the end of phase A, the output of comparators 70 and 72 are latched and provided to digital error corrector 28, and to the next stage if present. The cycle repeats with clock phase A transitioning low and clock phase B transitioning high.

As shown in FIG. 3, where the same magnitude potential threshold of opposite polarity is provided to comparator 70 and 72, selecting as outputs 98 a larger magnitude threshold from among the potential thresholds generated at taps 82 causes the slice point determined by comparator 70 to decrease and causes the slice point determined by comparator 72 to increase. Conversely, selecting as outputs 98 a smaller threshold from among the potential thresholds generated at taps 82 causes the slice point determined by comparator 70 to increase and causes the slice point determined by comparator 72 to decrease. However, the invention is not limited thereto. The slice points of comparators 70 and 72 may be moved independently of each other, in the same or opposite directions.

Alternatively, or in conjunction with the above-described technique for reducing converter non-linearity, a technique that may be seen with reference to FIG. 3 applies a constant threshold to comparators 70 and 72 (as would result from a single random number being applied to multiplexer 92, although a fixed threshold would suffice). Capacitors C1, C2, C3, and C4, in any combination, could be sized such that noise would introduce a dither effect on the threshold of comparators 70 and 72. Noise in the capacitor due to $(k \times T)/C$, where k is Boltzman's constant, T is the temperature of the capacitor in degrees Kelvin, and C is the capacitance in farads, is superimposed on a signal applied to the capacitor resulting in a dither effect on the comparator thresholds. One skilled in the art could size a capacitor for this type of operation. When a component is sized to introduce noise as the dither, the component may be considered the dither generator.

Figure 4:
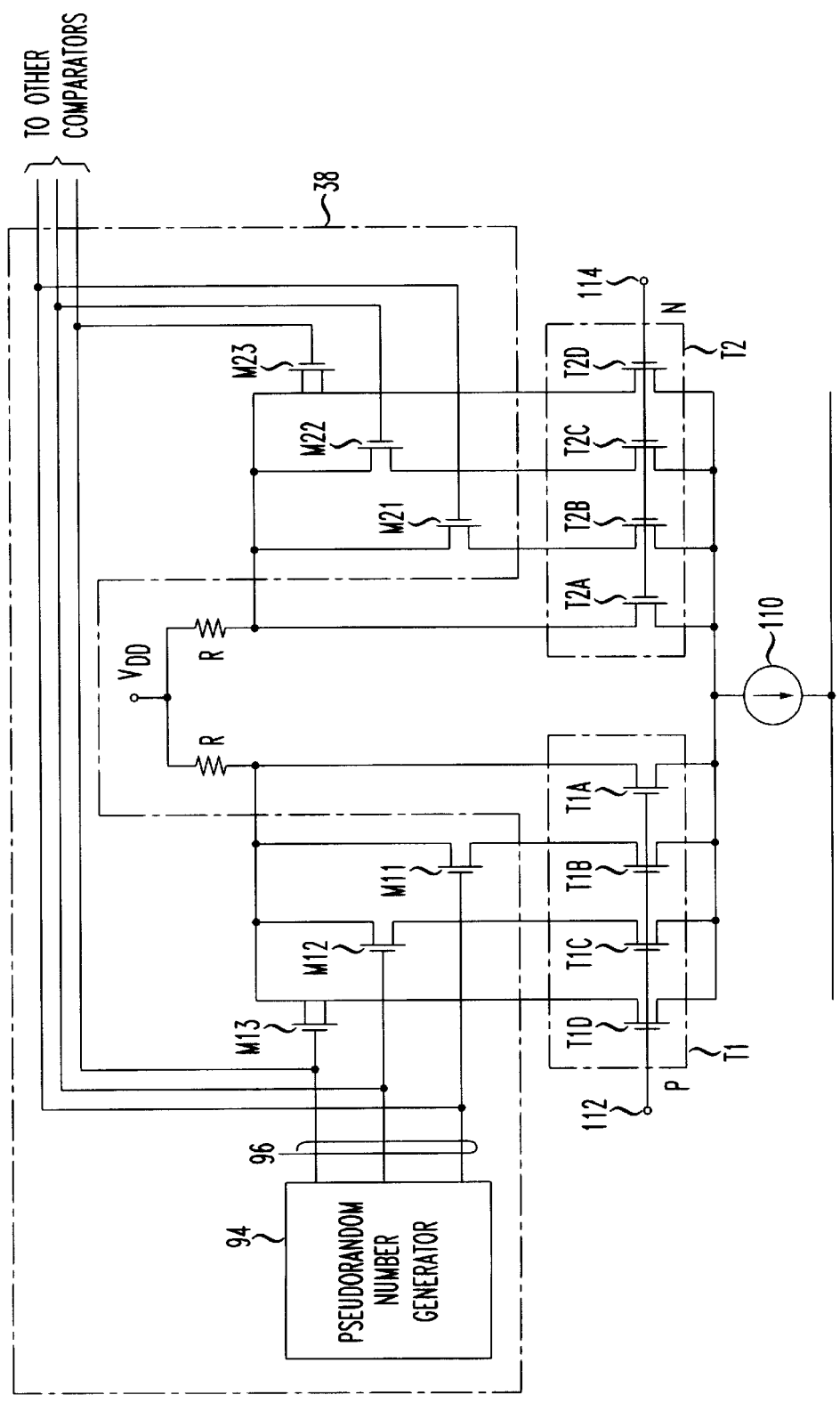
FIG. 4 is a simplified schematic diagram of a portion of an analog-to-digital converter illustrating an alternative embodiment analog-to-digital converter.

An alternative technique for dithering a threshold, and thus the slicing level in a slicing circuit, to reduce converter non-linearity is shown in a schematic diagram in FIG. 4. Random variations in the comparator threshold settings could be introduced to dither the slicing level or levels. The inputs to a comparator are a differential pair of transistors. The differential pair of transistors in FIG. 4 are represented by composite transistors T1 and T2. The drains of composite transistors T1 and T2 are coupled to a constant current source 110. With inputs coupled to differential inputs 112 and 114, as current through the drain of one of the transistors T1 or T2 increases, the current through the drain of the other transistor decreases.

Composite transistor T1 is comprised of a plurality of transistors such as T1A, T1B, T1C, and T1D. Similarly, composite transistor T2 is comprised of a plurality of transistors such as T2A, T2B, T2C, and T2D. Transistors T1A, T1B, T1C, T1D, T2A, T2B, T2C, and T2D may be the same size or different sizes. The number of transistors comprising transistor T1 or T2 that are active or turned on may be determined by a pseudo-random number generated by pseudo-random number generator 94. The relative size of composite transistors T1 and T2 will vary depending on the number and size of transistors comprising transistors T1 and T2 that are active, effectively shifting the threshold of a comparator including transistors T1 and T2. The pseudo-random number determines whether transistors M11, M12, or M13 are turned on, and in turn whether transistors T1B, T1C, or T1D are turned on, or active. Varying which of transistors M11, M12, or M13 are turned on thus varies the size of composite transistor T1 . Similarly, the pseudorandom number determines whether transistors M21, M22, or M23 are turned on, and in turn whether transistors T2B, T2C, or T2D are turned on, or active. Varying which of transistors M21, M22, or M23 are turned on thus varies the size of composite transistor T2. The same or a different pseudo-random number, of the same or different probability, may be provided to vary which of the transistors comprising each of transistors T1 and T2 are turned on. Varying the size of composite transistors T1, T2, or both, such as by varying the number of active transistors comprising composite transistors T1 or T2, changes the threshold of the comparator formed by the differential pair of composite transistors and hence the slicing point of a comparator including the differential pair of composite transistors. This technique of varying the threshold and hence the slicing point is susceptible to process variations and bias current variations, but is adequate for some applications.

Alternatively, or in conjunction with the above-described techniques of introducing dither, circuitry inside the comparators could generate random noise to dither the slicing level or levels. An example of circuitry inside a comparator generating random noise would be to size the differential pair of input transistors such that noise generated therein would randomly vary the comparator threshold and in turn the slicing point established by the comparator. One skilled in the art could size a transistor for this type of operation. Like other techniques, this technique of varying the threshold is susceptible to process variations and bias current variations, but is adequate for some applications.

A comparator can also be made to be noisy, for example, by modifying the comparator circuit such as making the differential pair of input transistors, if present, smaller such that the input referred noise is relatively larger. The effective comparator noise can also be controlled by reducing the signal magnitude at the input to the comparator. This can be achieved by adding an optional capacitor to the one or both of the comparators of FIG. 3. In FIG. 3, optional capacitor C5 is coupled between capacitors C1 and C2 at the inputs to comparator 72. Similarly, optional capacitor C6 is coupled between capacitors C3 and C4 at the inputs to comparator 70. The capacitors C1, C2, and C5, as well as capacitors C3, C4, and C6, form a voltage divider that reduces the amplitude of the signal at the input of comparators 72 and 70, respectively. Reducing the amplitude of the signal at the input of comparators 72 and 70 in effect reduces the signal-to-noise ratio and thereby increases the magnitude of the noise, relative to the magnitude of the signal, such that the noise can provide the function of dither. By reducing the signal level, the internal noise of the comparator will introduce random noise which will vary the slicing level.

The effect of dither is to decrease the magnitude of spurious tones in digital output 100 by spreading the tone energy over a wider frequency range than the spurious tones would occupy absent the dither. Using this technique, the dither is introduced without utilizing a portion of the frequency spectrum as in other dithering techniques. Introducing dither without utilizing a portion of the frequency spectrum leaves the full frequency spectrum available for signals. Furthermore, this technique of introducing dither does not use as much of the signal dynamic range as other dither techniques. The digital error correction introduced by digital error corrector 28 removes the effects of the threshold being moved by the dither, even for signals approaching full scale. In addition, the analog input signal does not have to be processed for inclusion of dither before being provided as an input to multistage converter 10, thereby reducing the complexity of the converter.

The invention is particularly useful in communications systems, signal processing applications, signal conversion applications, and audio equipment. Such applications have the advantage of introducing dither into a converter while not utilizing a portion of the signal frequency spectrum to introduce the dither, thereby maintaining the entire available frequency range for signal bandwidth. Spurious tones are reduced in magnitude and spread-out in frequency.

While an illustrative embodiment of the invention has been described in which each stage produced the same number of bits in the digital output, the invention is not limited thereto. The stages of the converter may produce differing numbers of bits as a digital output. Furthermore, while an illustrative embodiment of the invention has been described as providing a resistor string to generate the various alternative thresholds, the invention is not limited thereto. Other methods of generating the alternative thresholds are within the scope of the invention. In addition, it will be appreciated by those skilled in the art that a converter can be implemented in a switched capacitor architecture or an equivalent resistor architecture.

What is claimed is:

1. A multistage converter, comprising:
   a slicing circuit adapted to slice a signal into levels based on a threshold, the slicing circuit defining at least one slicing point;
   a threshold generating circuit adapted to generate a plurality of alternative threshold levels; and
   a selector circuit adapted to select one of the alternative threshold levels for application to the slicing circuit, whereby the slicing point may be varied by selection of various ones of the alternative threshold levels.

2. A converter as recited in claim 1, wherein the slicing circuit is single ended.

3. A converter as recited in claim 1, wherein the slicing circuit is fully differential.

4. A converter as recited in claim 1, wherein the converter is implemented in an integrated circuit.

5. A converter as recited in claim 4, wherein the integrated circuit is a microprocessor.

6. A converter as recited in claim 4, wherein the integrated circuit is a microcontroller.

7. A converter as recited in claim 4, wherein the integrated circuit is a digital signal processor.

8. A converter as recited in claim 1, wherein the slicing circuit produces a two bit digital output.

9. A converter as recited in claim 1, further comprising:
   an error corrector circuit, the error corrector circuit adapted to receive a digital output from the slicing circuit and generate a multibit output therefrom.

10. A converter as recited in claim 9, wherein the error corrector circuit corrects for variations in the digital output due to the presence of dither.

11. A converter as recited in claim 1, wherein the converter comprises more than one stage, each said more than one stage including a slicing circuit having a threshold for slicing a signal into levels, each slicing circuit having a dither generator adapted to vary each of the thresholds.

12. A converter as recited in claim 11, further comprising:
   an error corrector circuit, the error corrector circuit adapted to receive a digital output from each slicing circuit and generate a multibit output therefrom, the error corrector circuit also correcting for changes in the digital output due to the presence of dither.

13. A multistage converter as recited in claim 1, wherein the threshold generating circuit comprises a resistor divider providing a plurality of voltages as the plurality of alternative threshold levels.

14. A multistage converter as recited in claim 1, wherein the threshold generating circuit comprises a differential pair of composite transistors, the number of transistors active in the composite transistors varied to provide the plurality of alternative threshold levels.

15. A multistage converter as recited in claim 14, wherein the transistors comprising at least one of the differential composite pair of transistors are the same size.

16. A multistage converter as recited in claim 1, further comprising a dither generator adapted to vary at least one threshold.

17. A converter as recited in claim 16, wherein the dither generator is adapted to vary the at least one threshold over a predetermined number of alternative threshold values.

18. A converter as recited in claim 17, wherein each of the predetermined number of alternative threshold values has an equal probability of being applied as the threshold.

19. A converter as recited in claim 17, wherein each of the predetermined number of alternative threshold values has an unequal probability of being applied as the threshold.

20. A converter as recited in claim 16, wherein the dither generator is a noise source.

21. A multistage converter as recited in claim 20, wherein the noise source is a circuit component.

22. A method of converting a signal from one form to another, comprising the steps of:

slicing a signal into levels based on a threshold; and varying the number of active transistors in a composite transistor to vary the threshold.

23. A method of converting a signal from one form to another, comprising the steps of:

slicing a signal into levels based on a threshold; and varying the number of active transistors in each composite transistor of a differential pair of composite transistors to vary the threshold.

24. A method of converting a signal from one form to another, comprising the steps of:

slicing a signal into levels based on a threshold; and selecting the number of active transistors that comprise a composite transistor to vary the threshold.

25. A method of converting a signal from one form to another, comprising the steps of:

slicing a signal into levels based on a threshold; and generating a plurality of voltage levels; and varying the threshold by sequentially, randomly selecting one of the plurality of voltage levels as the threshold.

* * * * *